(12) United States Patent
More et al.

(10) Patent No.: US 11,848,689 B2
(45) Date of Patent: Dec. 19, 2023

(54) METHOD AND APPARATUS FOR COMPRESSION MULTIPLEXING FOR SPARSE COMPUTATIONS

(71) Applicant: Microsoft Technology Licensing, LLC, Redmond, WA (US)

(72) Inventors: Ankit More, San Mateo, CA (US); Mattheus C. Heddes, Richmond, WA (US); Nishit Shah, Sunnyvale, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/687,559

(22) Filed: Mar. 4, 2022

(65) Prior Publication Data
US 2023/0318620 A1    Oct. 5, 2023

(51) Int. Cl.
*H03M 7/30* (2006.01)
*G06F 5/01* (2006.01)

(52) U.S. Cl.
CPC ............ *H03M 7/3082* (2013.01); *G06F 5/01* (2013.01); *H03M 7/3066* (2013.01)

(58) Field of Classification Search
CPC ............ H03M 7/6017; H03M 7/6005; H03M 7/3066; H03M 7/30; H03M 7/3059; H03M 7/3062; H03M 7/3073; H03M 7/3082
See application file for complete search history.

(56) References Cited

U.S. PATENT DOCUMENTS

| 4,449,437 | A | * | 5/1984 | Cotton, Jr. | ............. | G10H 1/386 84/613 |
| 5,559,793 | A | * | 9/1996 | Maitra | .................. | H04L 65/762 379/406.06 |
| 5,694,334 | A | * | 12/1997 | Donahue | ................... | H04L 9/40 348/E7.071 |
| 10,929,132 | B1 | * | 2/2021 | Pawlowski | ............... | G06F 9/35 |
| 11,616,509 | B1 | * | 3/2023 | Lombardo | .......... | H03M 1/0668 341/144 |
| 2007/0126474 | A1 | | 6/2007 | Chang et al. | | |

(Continued)

FOREIGN PATENT DOCUMENTS

EP    3726733 A1    10/2020

OTHER PUBLICATIONS

"Crossbar Switch", Retrieved from: https://en.wikipedia.org/w/index.php?title=Crossbar_switch&oldid=1071036238, Feb. 10, 2022, 7 Pages.

(Continued)

*Primary Examiner* — Lam T Mai
(74) *Attorney, Agent, or Firm* — Fountainhead Law Group PC (57) ABSTRACT

Embodiments of the present disclosure include a digital circuit and method for compressing input digital values. A plurality of input digital values may include zero values and non-zero values. The input digital values are received on M inputs of a first switching stage. The first switching stage is arranged in groups that rearrange the non-zero values on first switching stage outputs according to a compression and shift. The compression and shift position the non-zero values on outputs coupled to inputs of a second switching stage. The second switching stage consecutively couples non-zero values to N outputs, where N is less than M.

20 Claims, 9 Drawing Sheets

(56) References Cited

U.S. PATENT DOCUMENTS

| | | | | |
|---|---|---|---|---|
| 2007/0279274 A1* | 12/2007 | Hsieh | .................. | H03M 1/1225 341/155 |
| 2007/0280061 A1* | 12/2007 | Lan | .................. | G11B 20/10027 |
| 2007/0280062 A1* | 12/2007 | Lan | .................. | G11B 20/10046 369/44.34 |
| 2007/0280066 A1* | 12/2007 | Liao | ...................... | G11B 7/0941 369/44.29 |
| 2007/0280086 A1* | 12/2007 | Yu | ........................ | G11B 7/1263 369/116 |
| 2007/0291613 A1* | 12/2007 | Liao | ...................... | G11B 20/10 369/124.05 |
| 2007/0291620 A1* | 12/2007 | Yu | ........................ | G11B 7/1263 369/53.26 |
| 2007/0291622 A1* | 12/2007 | Lan | ...................... | G11B 7/1263 369/44.34 |
| 2017/0064320 A1* | 3/2017 | Sadhwani | ................. | G06T 1/20 |
| 2018/0081986 A1* | 3/2018 | Sitik | ................... | G06F 16/9024 |
| 2023/0060711 A1* | 3/2023 | Bertness | ............ | H03K 17/6871 |

OTHER PUBLICATIONS

Parashar, et al., "SCNN: An Accelerator for Compressed-sparse Convolutional Neural Networks", In Proceedings of the 44th Annual International Symposium on Computer Architecture, ISCA, ACM Press, Jun. 24, 2017, pp. 27-40.

"International Search Report and Written Opinion Issued in PCT Application No. PCT/US22/051301", dated Mar. 20, 2023, 16 Pages.

Rhu, et al., "Compressing DMA Engine: Leveraging Activation Sparsity for Training Deep Neural Networks", In Proceedings of IEEE International Symposium on High Performance Computer Architecture (HPCA), Feb. 24, 2018, pp. 78-91.

* cited by examiner

Physical

```
input: M inputs, N outputs, P inputs per group
       bit_vector of length M
output: input_select mux selection logic for input stage
        output_select mux selection logic for output stage num_groups = ceil(M/P)
for i := 0 to num_groups-1 do
    active_inputs[i] = sum(bit_vector[(i+1)*P -1 : i*P])
prefix = exclusive_prefix_sum(active_inputs)

for i := 0 to num_groups-1 do
    input_select[i] = compress_zeros(bit_vector[(i+1)*P -1 : i*P], P)
    input_select[i] = barrel_shfit(input_select[i], prefix[i])
    output_bit_vector[i] = bit_vector[i*P + input_select[i]]

output_bit_vector_transpose = transpose(output_bit_vector)

for j := 0 to N-1 do
    output_select[j] = first_bit_set(output_bit_vector_transpose[j])

compress_zeros(bit_vector, length):
    idx = 0
    for i := 0 to length - 1 do
        if bit_vector[i]
            select[idx] = i
            idx++
    return select
```

Fig. 6B

| Implementation unit | Stages | Configuration | Cost per 64x16 compression mux | Cost per (4x8) matmul @8b | Savings |
|---|---|---|---|---|---|
| 64x16 crossbar | 1 | 64x16 | 1K (2:1 muxes) | 256K (2:1 muxes) | - |
| 8x8 crossbar | 2 | 8 * (8x8) \| 16 * (7:1) | 544 (2:1 muxes) | 139K (2:1 muxes) | ~45% |
| 8x8 Benes | 2 | 8 * (8x8) \| 16 * (7:1) | 416 (2:1 muxes) | 106K (2:1 muxes) | ~58% |
| 4x4 crossbar | 3 | 16 * (4x4) \| 8 * (4x4) \| 16 * (3:1) | 320 (2:1 muxes) | 82K (2:1 muxes) | ~68% |
| 2x2 switch | 4 | 32 * (2x2) \| 32 * (2x2) \| 8 * (4x4) \| 16 * (3:1) | 256 (2:1 muxes) | 64K (2:1 muxes) | 75% |

METHOD AND APPARATUS FOR COMPRESSION MULTIPLEXING FOR SPARSE COMPUTATIONS

BACKGROUND

The present disclosure relates generally to digital circuits and systems, and in particular to a method and apparatus for compression multiplexing for sparse computations.

Many modern digital systems and applications are required to process large volumes of digital values. For example, artificial intelligence applications may be required to store (e.g., in memory) and process (e.g., perform mathematical operations) are huge arrays of digital values representing activations or weights. However, in many cases such large volumes of data may contain a large number of zero values. Computation of zero values is often an exception for processing and may be skipped or otherwise ignored by a system.

Input data sets typically have zero values and non-zero values randomly distributed over the data set with zero values typically representing a certain percentage (referred to as sparsity) of the total data set. For AI accelerators and workloads, for example, sparsity is an increasingly important feature that needs to be supported in hardware to achieve performance speed-up. As part of enabling this sparsity, the data corresponding to the zero elements may be removed.

Embodiments described herein advantageously eliminate zero values from a data set to improve the efficiency of processing digital values.

DETAILED DESCRIPTION

Described herein is a hierarchical compression technique. In the following description, for purposes of explanation, numerous examples and specific details are set forth in order to provide a thorough understanding of some embodiments. Various embodiments as defined by the claims may include some or all of the features in these examples alone or in combination with other features described below and may further include modifications and equivalents of the features and concepts described herein.

In some embodiments, features and advantages of the present disclosure include circuit techniques for removing zeros from a data set and thereby compress non-zero values. Embodiments of the present disclosure proposes a solution which uses the properties of sparsity which may reduce the area complexity. Certain embodiments disclosed herein result in a significant area savings which allows us to increase the sparsity levels that can be supported and/or increasing the performance per unit area of the hardware, for example.

Figure 1:
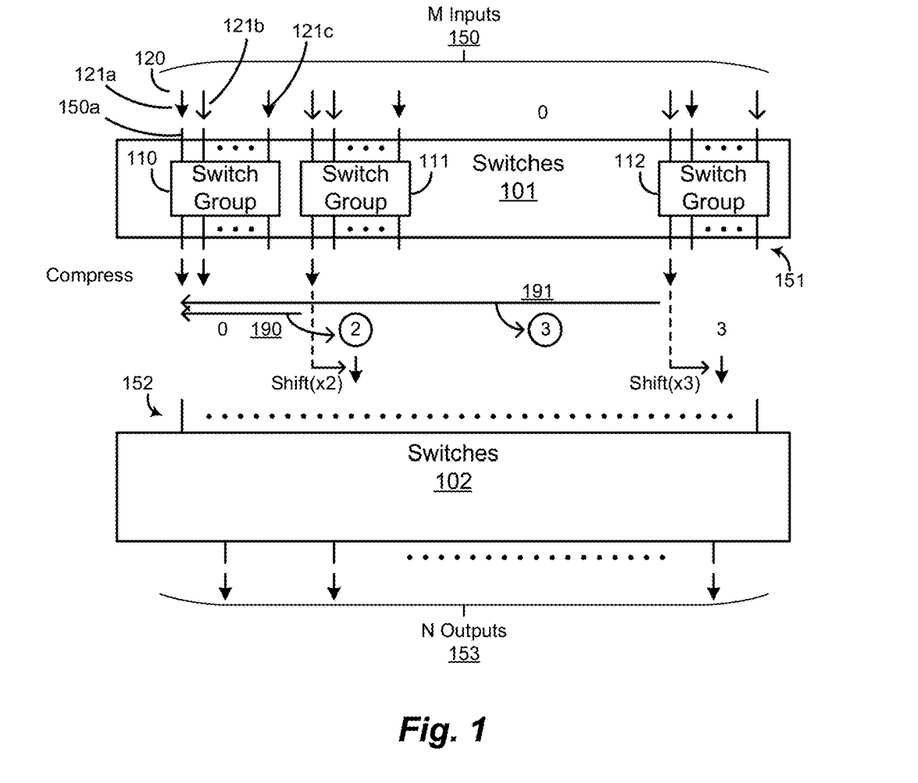
FIG. 1 illustrates a digital circuit according to an embodiment.

FIG. 1 illustrates a digital circuit according to an embodiment. Features and advantages of the present disclosure include multiple stages of switches configured to remove zeros and compress input digital values. In FIG. 1, first switches 101 receive a plurality of input digital values 120 on M inputs 150. The input digital values may each be digital representations of one or more numbers, such as operands to be processed by and AI processor, for example. The input digital values may be stored in a variety of formats, such as various integer or floating-point formats, for example. As mentioned above, input digital values may have zero and non-zero values. Non-zero values are represented in FIG. 1 by closed arrows (e.g., 121*a*) and zero values are represented by open arrows (e.g., 121*b*). The zero values and non-zero values may be randomly distributed across an input data set. According, the inputs 150 of switches 150 may receive zero and non-zero values at different positions at different times. As described in more detail below, for a digital compression circuit with M inputs and N outputs, the input digital values may have not more than N non-zero values on the M inputs at any given time, where M and N are integers and M is greater than N (i.e., the number of inputs is greater than the number of outputs).

Switches 101 are arranged in a plurality of groups of switches (or "switch groups") 110-112, and each group may have the same number of inputs, for example. Non-zero values received on inputs of each group of switches may be compressed to adjacent outputs, beginning on a distal output, of each group. For example, Switch group 110 may receive two non-zero inputs 121*a* and 121*c*. One function of switches 101 may include compressing the non-zero values to adjacent outputs on the distal output of the switch group, which is illustrated in FIG. 1 as the two (2) adjacent non-zero values in the first two left hand positions of switch group 110.

Additionally, switches 101 may shift the non-zero values by an amount equal to a total number of non-zero inputs received on inputs of other groups between a particular group and a distal input of the M inputs of switches 101. For instance, in this example, switch group 110 receives two (2) non-zero values, switch group 111 receives one (1) non-zero value, switch group 112 receives one (1) non-zero value, and the switch groups between switch groups 111 and 112 (not shown) receive all zero values. Thus, for switch group 110, there are zero (0) non-zero inputs between itself and the distal input 150*a* of the M inputs 150. For switch group 111, there are two (2) non-zero values (e.g., 121*a* and 121*c*) between switch group 111 and distal input 150*a* as illustrated at 190. Finally, for switch group 112, there are three (3) non-zero values between switch group 112 and distal input 150*a*, as illustrated at 191. These numbers may represent the number of shifts needed to shift a non-zero value on the output of a particular switch group to ensure there is no overlap across all the outputs of the switch groups, for example, and may be referred to herein as the "exclusive prefix sum," or just "prefix sum."

The outputs 151 of the switches 101 are coupled to the inputs 152 of switches 102. Switches 102 are configured to consecutively couple non-zero output values of switches 101 to N outputs 153 of switches 102. For instance, for N non-zero input values on the M inputs 153, the outputs of switches 101 have N non-zero output values, where the non-zero values are shifted to positions where they can be consecutively coupled to N outputs 153. Specifically, the two (2) non-zero output values of switch group 110 may be coupled to the first left most outputs of N outputs 153. Similarly, the shifted non-zero output value of switch group 111 may be coupled to the next consecutive output of N outputs 153. Lastly, the shifted non-zero output value of switch group 112 may be coupled to the next consecutive output of N outputs 153. Accordingly, for N non-zero input values on M inputs, switches 101 and 102 produce N non-zero output values on N outputs 153. Accordingly, switches 101 and 102 may compress up to N non-zero values out of M input values, which may be up to a target sparsity of 1−(N/M) (e.g., where sparsity is the percentage of zero values in all the input values).

Figure 2:
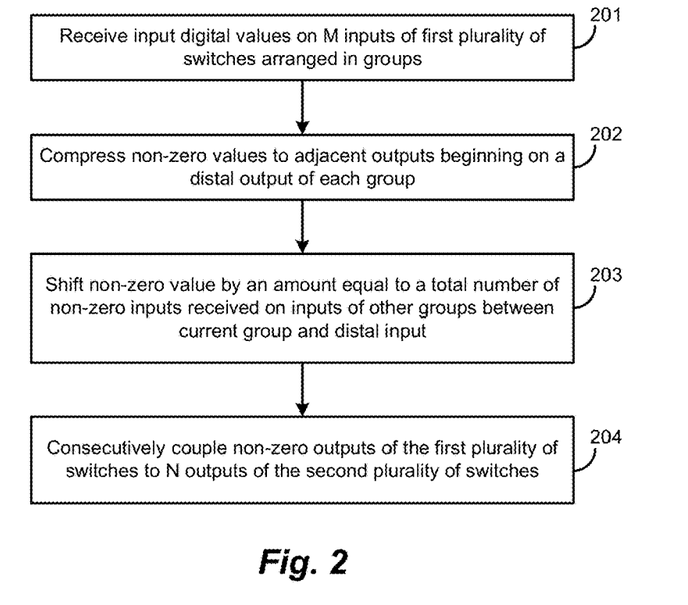
FIG. 2 illustrates a method according to an embodiment.

FIG. 2 illustrates a method according to an embodiment. The present algorithm may be performed on multiple switch blocks as described above in FIG. 1, for example. At 201, input digital values are received on M inputs of a first plurality of switches. The input digital values may have not more than N non-zero values, where N is the number of outputs of a second plurality of switches, for example. The first plurality of switches may be arranged in a plurality of groups of switches, where M and N are integers and M is greater than N, for example. At 202, the non-zero values received on inputs of each group of switches are compressed to adjacent outputs, beginning on a distal output, of each group. Additionally, at 203, the non-zero values on the adjacent outputs may be shifted by an amount equal to a total number of non-zero inputs received on inputs of other groups between a particular group and a distal input of the M inputs of the first plurality of switches. In one embodiment, the compression and shifting may be implemented together in one step by switches 101, for example. At 204, non-zero outputs of the first plurality of switches are consecutively coupled to the N outputs of the second plurality of switches. Accordingly, non-zero values may be produced by the second plurality of switches from a distal output (e.g., a left most position), consecutively, up to an Nth output, for example.

EXAMPLES

Figure 3:
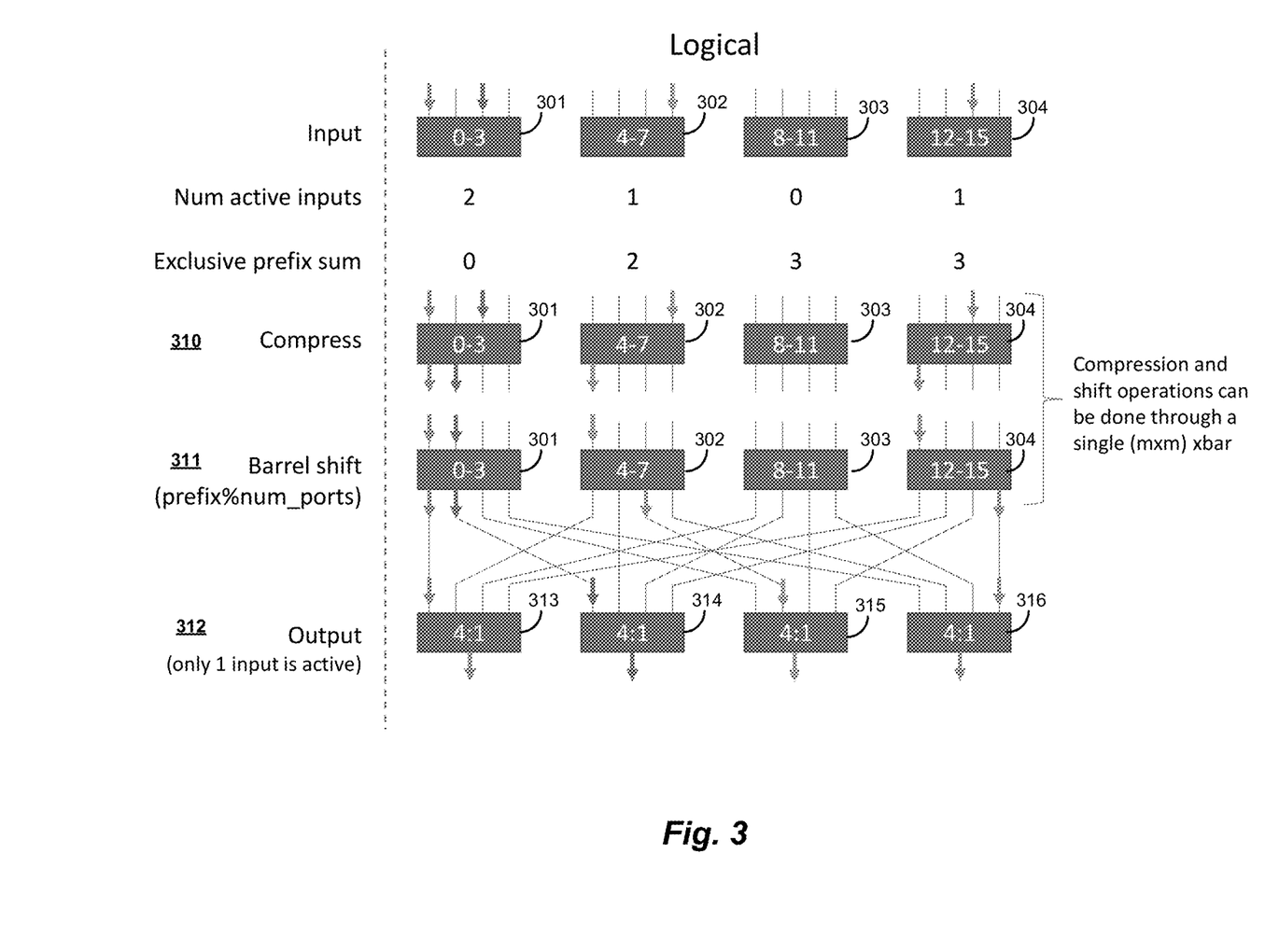
FIG. 3 illustrates a logical architecture for hierarchical compression according to an embodiment.

FIG. 3 illustrates a logical architecture for hierarchical compression according to an embodiment. The example in FIG. 3 is for M:N=16:4 compression at 25% sparsity. In this example, the inputs are arranged as four (4) groups of 4×4 crossbars 301-304 each having four (4) inputs and four (4) outputs. Crossbar 301 has non-zero (NZ) input values on the $1^{st}$ and $3^{rd}$ inputs, crossbar 302 has NZ input values on the $4^{th}$ input, crossbar 303 has no NZ values, and crossbar 304 has a NZ input on the $3^{rd}$ input. Thus, the number of NZ input values shown below each crossbar may be used to determine the prefix sums for each group. As shown, crossbar 301 has 2 NZ values between itself and the distal input (e.g., here, the left most input), crossbar 302 has 3 NZ values, and crossbar 304 has 3 NZ values.

Compression is shown at 310. In this example, the NZ input values on the $1^{st}$ and $3^{rd}$ inputs of crossbar 301 are compressed to the first and second output positions of crossbar 301. The NZ input value on the $4^{th}$ input of crossbar 302 is compressed to the first output position of crossbar 302. Finally, the NZ input value on the $3^{rd}$ input of crossbar 304 is compressed to the first output position of crossbar 304.

Shifting is shown at 311. In this example, crossbars 301-304 further implement a shift of the compressed NZ values based on the number of NZ values between the particular group and the distal input (here, the left most input position of crossbar 301). For example, the NZ value in crossbar 302 is shifted right two (2) positions, and the NZ value in crossbar 304 is shifted right by 3 positions. In this example, the shifting may include barrel shifting so NZ values wrap around each crossbar as illustrated further below.

The compressed and shifted NZ values on outputs of the crossbars are coupled to inputs of the second switch, which in this example comprises four (4) 4:1 multiplexers ("MUXs") 313-316. MUX 313 is configured to select the NZ output in the left most position (the $1^{st}$ output) of crossbar 301. MUX 314 is configured to select the next consecutive NZ value available, which in this case is the NZ value in the $2^{nd}$ output position of MUX 301. Similarly, MUX 315 is configured to select the next consecutive NZ value, which is the NZ value on the $3^{rd}$ output position of crossbar 302. Finally, MUX 316 is configured to select the next consecutive NZ value, which is the NZ value on the 4th output position of crossbar 304.

Figure 4A:
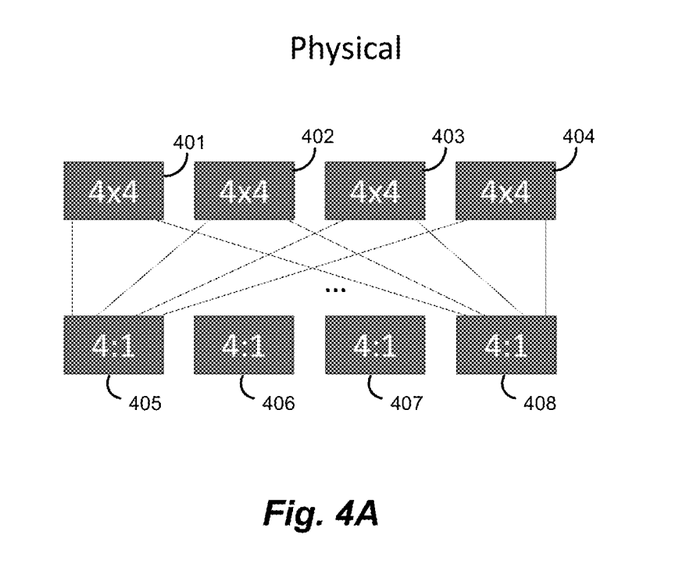
FIG. 4A illustrates a physical architecture for hierarchical compression according to an embodiment.

FIG. 4A illustrates a physical architecture for hierarchical compression according to an embodiment. In this example, the switches are configured as four (4) 4×4 crossbars 401-404 that receive M=16 inputs and, in this example, produce 16 outputs. The outputs of crossbars 401-404 fan out to inputs of four (4) 4:1 multiplexers 405-408. Crossbars 401-404 are configured to receive 16 input values and couple the input values to 16 outputs such that the input values are rearranged according to the compression and shifting logically described above. Multiplexers 405-408 have inputs coupled to outputs of the crossbars 401-404. Multiplexers 405-408 are configured to consecutively couple NZ values on the outputs of the crossbars 401-404 (e.g., starting on the far left and progressing consecutively to the right) to N=4 outputs of the multiplexers. Up to N=4 NZ values may be compressed from M=16 inputs to N=4 outputs (e.g., 75% sparsity) using the example circuits in FIG. 4A.

Figure 4B:
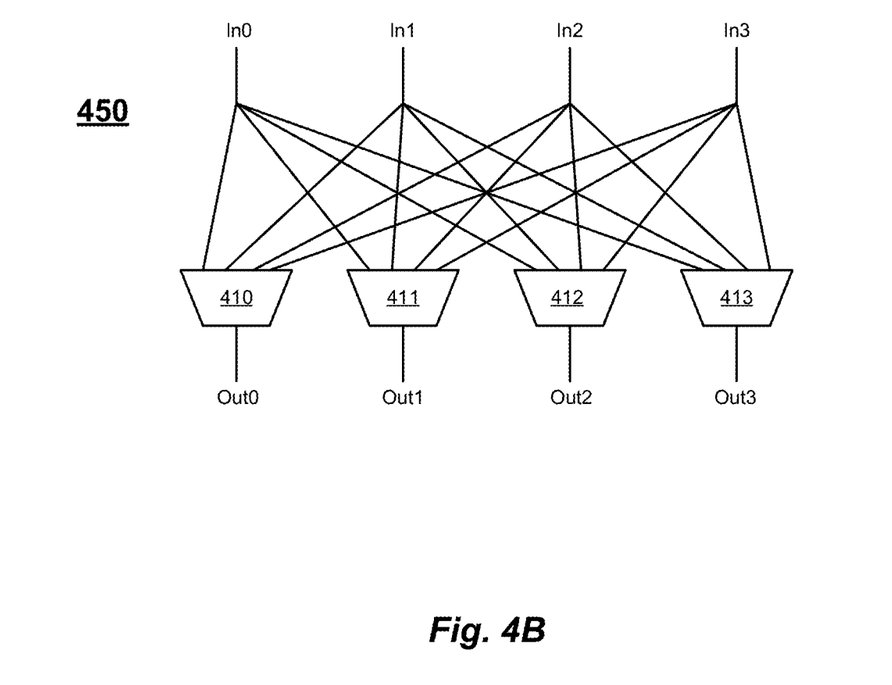
FIG. 4B illustrates an example of a crossbar switch according to an embodiment.

FIG. 4B illustrates an example of a crossbar switch 450 according to an embodiment. Four (4) such crossbars are used in FIG. 4A. Crossbar 450 includes four (4) inputs, In0-In3, which fan out to four (4) multiplexers 410-413. Multiplexers 410-413 have outputs, Out0-Out1. Accordingly, any input may be coupled to any output to implement the compress and shift functions described above in a single operation.

Figure 5A:
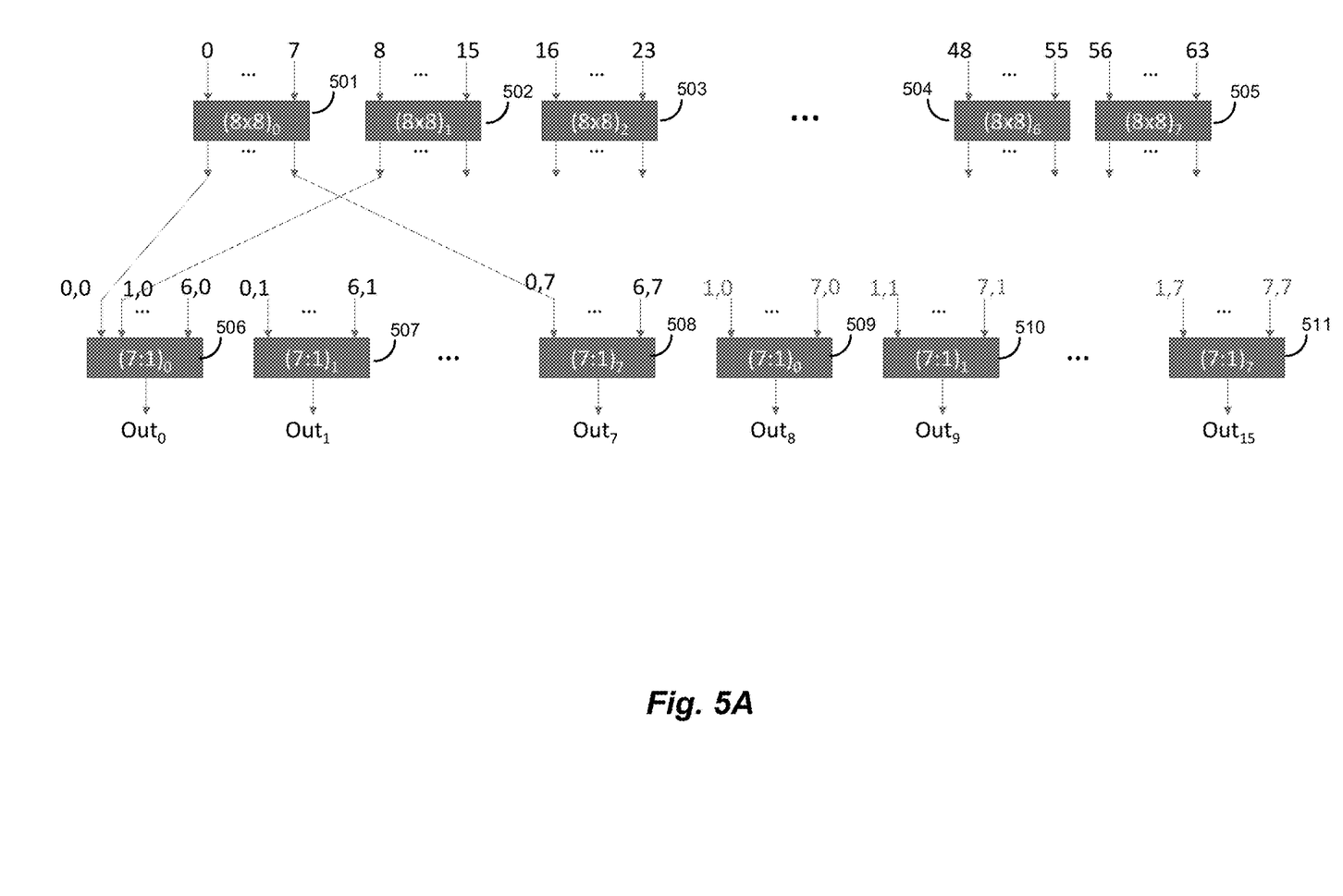
FIG. 5A illustrates another example of an architecture for hierarchical compression according to an embodiment.

FIG. 5A illustrates another example of an architecture for hierarchical compression according to an embodiment. In this example, the circuit compresses M=64 input digital values down to N=16 digital output values (e.g., for a target of at least 75% sparsity). The first switch stage comprises eight (8) 8×8 crossbars, and the second switch stage comprises sixteen (16) seven (7) input and one (1) output multiplexers (i.e., 7:1 MUXs). As illustrated here, a variety of switch group sizes may be used in various embodiments. The present example circuit further illustrates that the number of outputs of the first stage may be, or may not be, equal to the number of inputs of the second switch stage. In this example, the first switch stage comprises M=64 inputs and M=64 outputs. However, the second switch stage comprises fifty-six (56) inputs (i.e., fewer inputs than the number of outputs of the first switch stage).

In some embodiments, a distal group of switches (e.g., crossbar 501) of a plurality of groups of switches (e.g., crossbars 501-505) is coupled to a first half of switches in the second stage and not connected to a second half of switches in the second stage, and another distal group of switches (e.g., crossbar 505) is coupled to the second half of switches in the second stage and not connected to the first half of switches in the second stage. For instance, in this example, each second stage MUX 506-511 has a number of inputs equal to the number of switch groups in the first switch stage minus 1 (e.g., 8 crossbars–1=7 inputs on each output MUX 506-511). Additionally, each input of each second stage MUX 506-511 may be coupled to the same output position of each group for all groups 501-505 except the distal groups (e.g., crossbars 501 and 505). More specifically, in this example, outputs of crossbar 501 are coupled to the lower half of output MUXs 506-508 but not the upper half of MUXs 509-511. Similarly, outputs of crossbar 505 are coupled to the upper half of output MUXs 509-5011 but not the lower half of MUXs 506-518. The reason the paths of the distal groups may be eliminated, in this example, may be understood by considering the two extreme cases where all the outputs of either crossbar 501 or 505 are all NZ values. In this example, for 16 outputs, if all 8 outputs of crossbar 505 are NZ, then they will be coupled to the upper half MUXs 509-511 and not the lower half MUXs 506-508. Similarly, if all 8 outputs of crossbar 501 are NZ, then they will be coupled to the lower half MUXs 506-508 and not the upper half MUXs 509-511. Accordingly, paths from the crossbar 505 to the lower half MUXs, as well as paths from the crossbar 501 to the upper half MUXs, may not be necessary, thereby advantageously reducing the circuit area. Operation of the circuit in FIG. 5A is illustrated in FIG. 5B below.

Figure 5B:
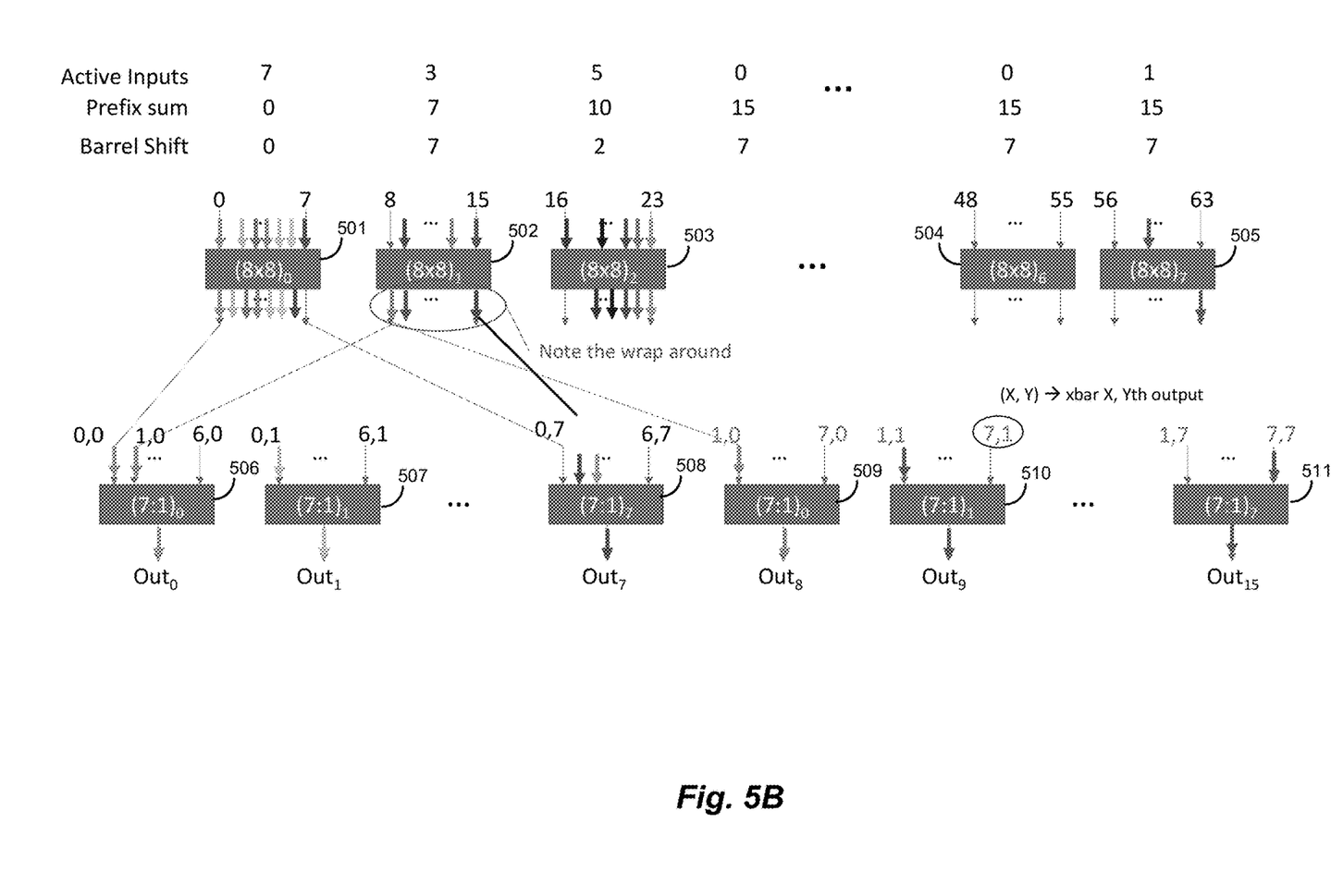
FIG. 5B illustrates an example of compression and shifting according to an embodiment.

FIG. 5B illustrates an example of compression and shifting according to an embodiment. In this example, crossbar 501 receives 7 NZ (or active) input values, crossbar 502 receives 3 NZ input values, crossbar 503 receives 5 NZ input values, crossbar 505 receives 1 NZ input value, and the other crossbars receive only zero values. Accordingly, the prefix sum for each group (here, crossbars) is shown. Crossbar 502 has a shift of 7, crossbar 503 has a shift of 10, and crossbar 505 has a shift of 15. In some embodiments, the shift may cause NZ values to wrap around. Accordingly, in various embodiments, a barrel shifter may be used. A barrel shifter is a digital circuit that can shift a data word by a specified number of bits using combinational logic. Barrel shifters may be used to implement unary operations, such as logical shift left, for example. Since the shift may wrap NZ input values around the outputs, the shift may be determined using a modulo of the number of shifts (e.g., the prefix sum) and the number of outputs of the group (e.g., the crossbar) as follows:

Shift=prefix sum MOD #outputs

In this example, the three NZ inputs of crossbar 502 are compressed against a distal output and shifted, and the shift wraps the NZ values on the output to the positions shown. For crossbar 503, prefix sum MOD 8 yields a shift of 2, which results in the NZ values on the output positions as shown.

In this example, outputs of distal crossbar 501 are coupled to inputs of second stage lower half MUXs 506-508, outputs of distal crossbar 505 are coupled to inputs of second stage upper half MUXs 509-511, and outputs of intermediate crossbars 502 through 504 are coupled to inputs of all the second stage MUXs 506-511.

The inputs of the second stage MUXs are labeled to show the mapping to corresponding crossbar outputs. Here, the first number represents the crossbar group the input is coupled to, and the second number represents the output position of the particular crossbar group the MUX input is coupled to. Accordingly, the 7 inputs of MUX 506 are coupled to the $0^{th}$ (or first) output of each of 7 crossbars 0-6 (e.g., crossbars 501 through 504). Similarly, the 7 inputs of MUX 507 are coupled to the 1 (or second) output of each of 7 crossbars 0-6 (e.g., crossbars 501 through 504). Likewise, the 7 inputs of MUX 508 are coupled to the 7 (or eighth) output of each of 7 crossbars 0-6 (e.g., crossbars 501 through 504). Note that the lower half of output MUXs are not connected to outputs of MUX 505 as described above.

Conversely, the 7 inputs of MUX 509 are coupled to the $0^{th}$ (or first) output of each of 7 crossbars 1-7 (e.g., crossbars 502 through 505). Similarly, the 7 inputs of MUX 510 are coupled to the 1 (or second) output of each of 7 crossbars 1-7 (e.g., crossbars 502 through 505). Likewise, the 7 inputs of MUX 511 are coupled to the 7 (or eighth) output of each of 7 crossbars 1-7 (e.g., crossbars 502 through 505). Note that the upper half of output MUXs are not connected to outputs of MUX 501 as described above.

As illustrated in FIG. 5B, the 7 NZ values on the output of crossbar 501 are coupled to the first 7 outputs of the second switch stage (e.g., Out0-Out6). The input of MUX 508 is coupled to the zero value in position 7 of crossbar 501 and the NZ value in position 7 of crossbar 502, which becomes the next consecutive output (e.g., the output was shifted to an output position corresponding to the next consecutive output) on Out 7. Similarly, the NZ value shifted to the 0 position (or first output position) of crossbar 502 is coupled to MUX 509 and is consecutively output on Out8, and the NZ value shifted to the 1 position (or second output position) of crossbar 502 is coupled to MUX 510 and is consecutively output on Out9. Finally, the NZ value shifted to the 7 position (or eighth output position) of crossbar 505 is coupled to MUX 511 and is consecutively output on Out15.

In the above description, the term "distal group" has been used. In the context of the present disclosure, a distal group (e.g., a distal crossbar) is a group of switches in the input switch stage that receives a plurality of input values at either edge of the inputs (e.g., first and last elements of an input array of values). Distal switch groups may receive input values in positions corresponding to first and last positions of a bit map vector, for example, which is described in more detail below.

Figure 6A:
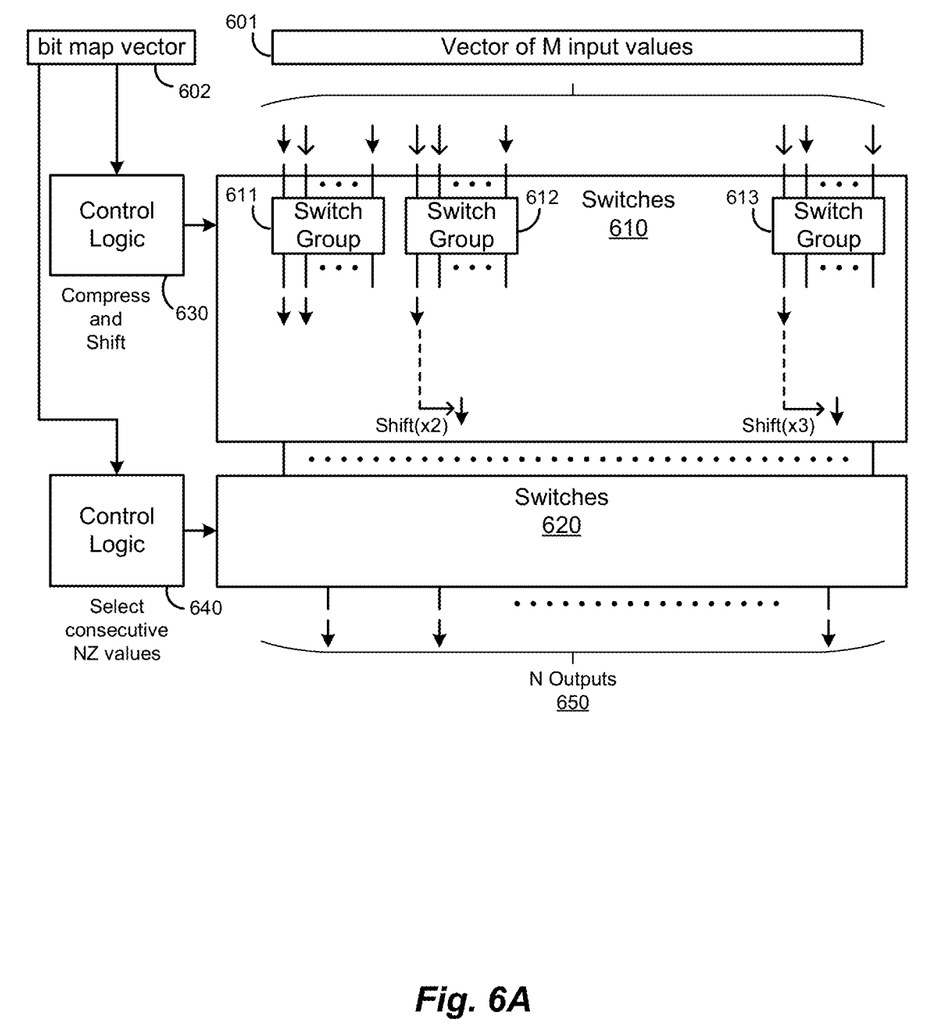
FIG. 6A illustrates an example architecture including control logic for controlling switches according to various embodiment.
Figure 6B:
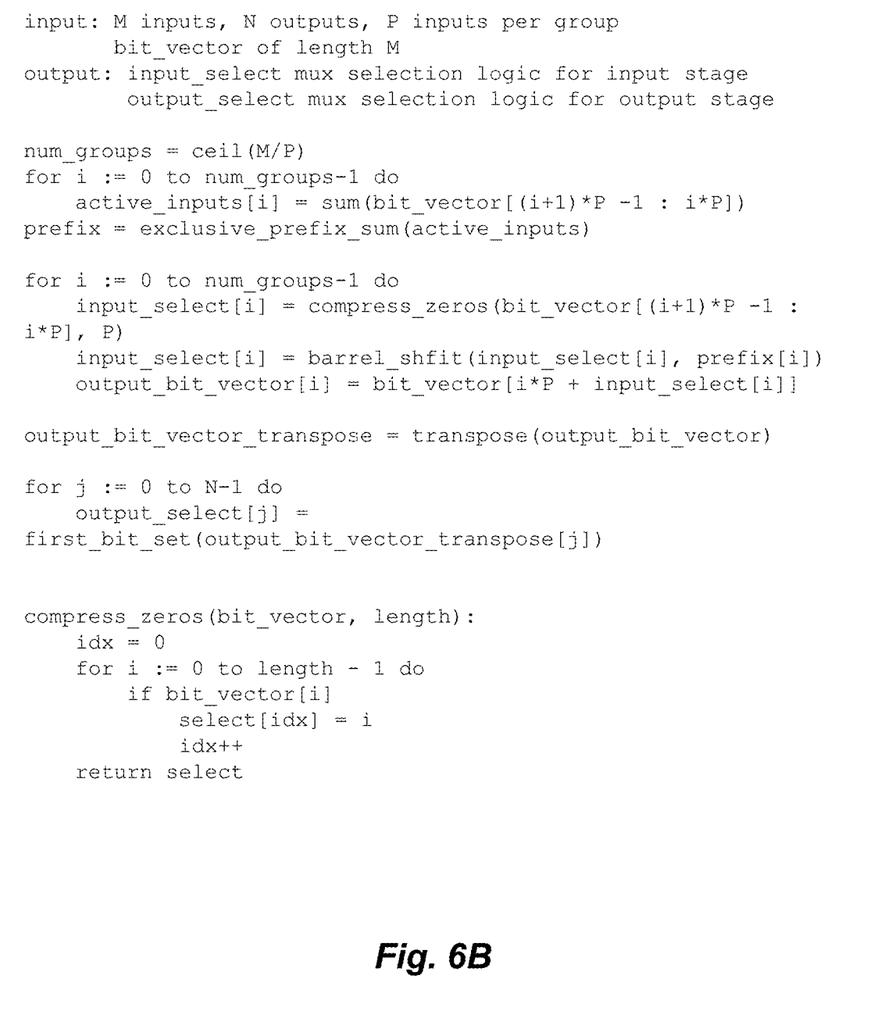
FIG. 6B illustrates example pseudo-code for controlling switching stages according to an embodiment.

FIG. 6A illustrates an example architecture including control logic for controlling switches according to various embodiment. Here, a vector of M input values 601 is received on inputs of a first stage of switches 610 arranged in switch groups 611-613. The outputs of switches 610 are coupled to a second stage of switches 620 comprising N outputs 650, which may generate up to N non-zero output values. In this example, the input values are associated with a bit map vector that specifies the position of non-zero (or zero) values. The bit map vector 602 may be coupled to control logic 630 and used to generate control signals to the switches to implement the compression and shifting so that each input value to each group is coupled to the appropriate output of each switch group. Similarly, the bit map vector 602 may be coupled to control logic 640 and used to generate control signals to the switches to consecutively couple NZ values on the outputs of switches 610 to the N outputs of switches 650. FIG. 6B illustrates example pseudo-code for controlling switching stages according to an embodiment.

Figure 7:
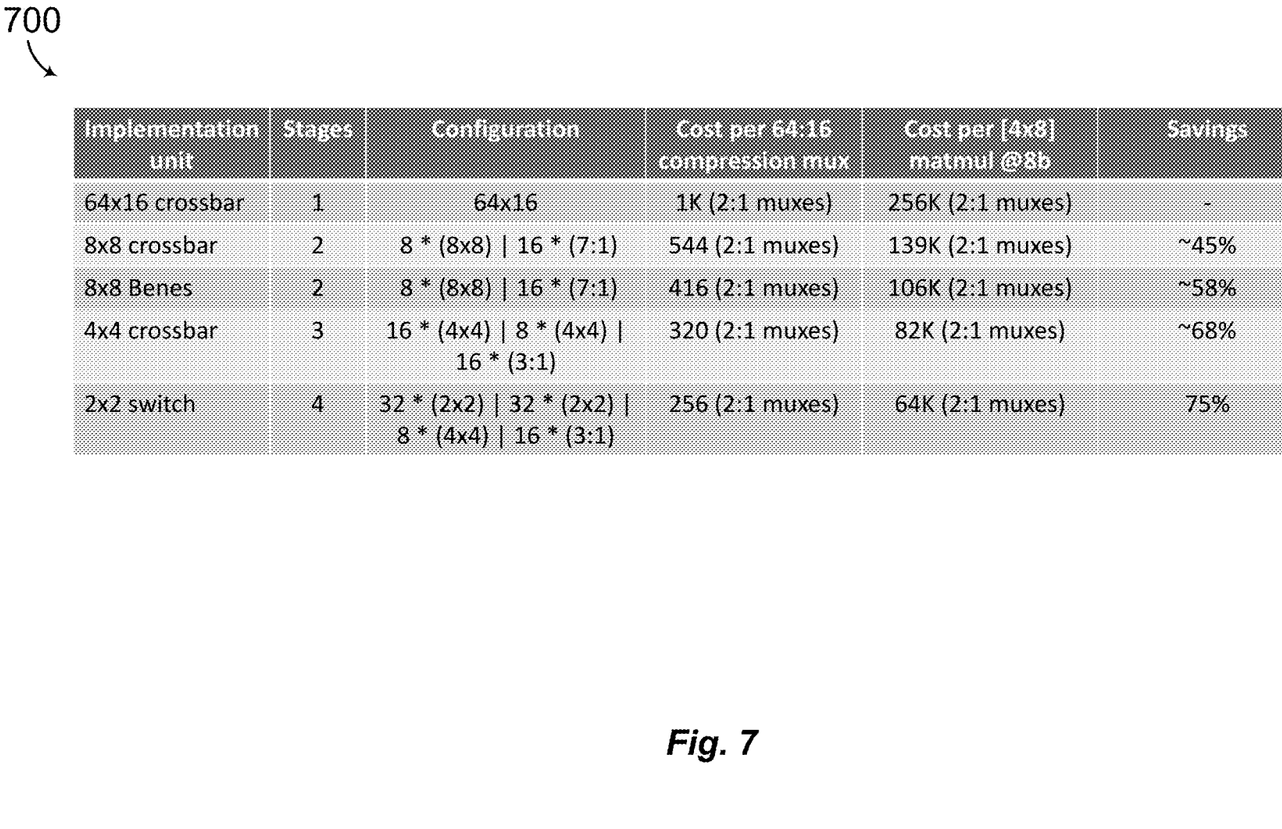
FIG. 7 illustrates area costs associated with different multiplexer sized according to various embodiments.

FIG. 7 illustrates area costs associated with different multiplexer sized according to various embodiments. Table 700 illustrates costs for various implementations of compression. A 64:16 single stage crossbar sets the baseline for comparison, with 1k 2:1 muxes. An 8×8 crossbar 2-stage implementation may use 544 2:1 muxes for a 45% savings. Other implementations of switching stages may use different group sizes and configurations. For example, an 8×8 Benes implementation may result in approximately 58% savings, a 3 stage 4×4 crossbar implementation may result in approximately 68% savings, and a 4 stage 2×2 switch implementation may result in a 75% cost savings. Configurations for each alternative architecture are shown in table 700.

Figure 8:
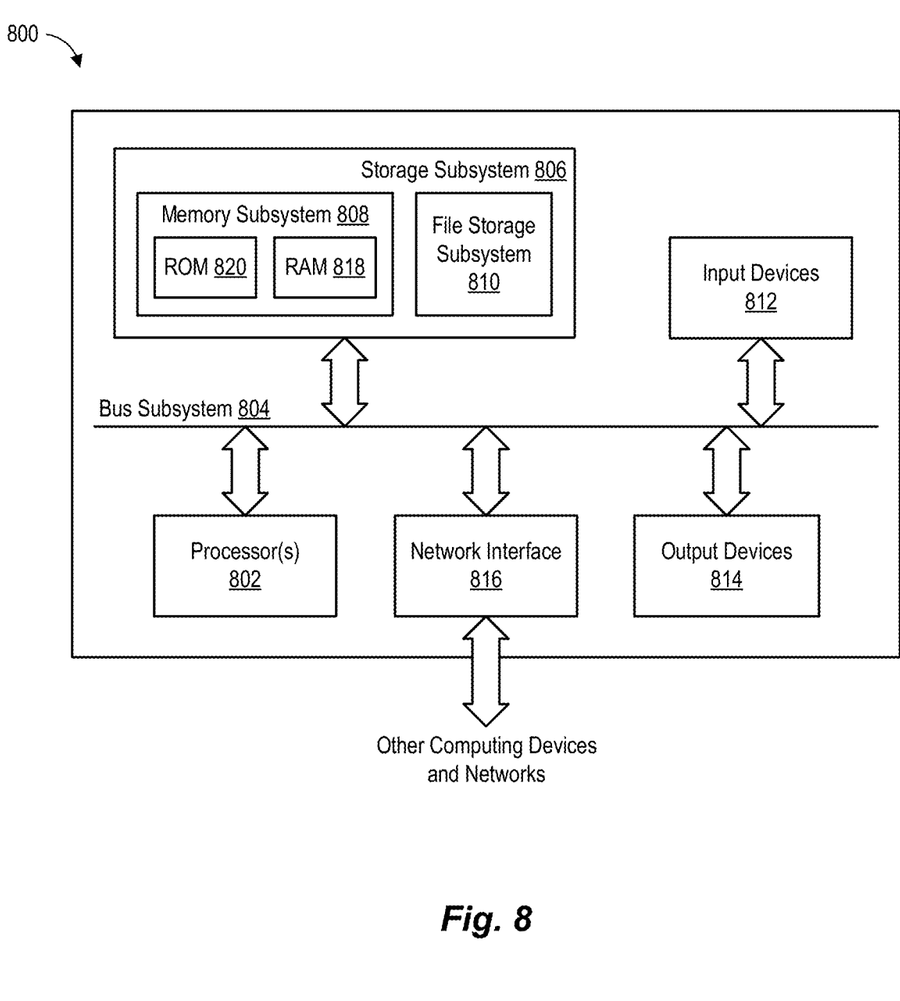
FIG. 8 illustrates a simplified block diagram of an example computer system used to execute HDL code according to various embodiments.

FIG. 8 illustrates a simplified block diagram of an example computer system used to execute hardware description language (HDL) code according to various embodiments. A hardware description language (HDL) is a specialized computer language used to describe the structure and behavior of electronic circuits, and most commonly, digital logic circuits. HDL code may be executed on a computer system to generate digital logic circuits, including circuits described herein. FIG. 8 illustrates a simplified block diagram of an example computer system 800, which can be used to implement the techniques described in the foregoing disclosure. In some embodiments, computer system 800 may be used to implement a control processor 802, for example. As shown in FIG. 8, computer system 800 includes one or more processors 802 that communicate with a number of peripheral devices via a bus subsystem 804. These peripheral devices may include a storage subsystem 806 (e.g., comprising a memory subsystem 808 and a file storage subsystem 810) and a network interface subsystem 816. Some computer systems may further include user interface input devices 812 and/or user interface output devices 814.

Bus subsystem 804 can provide a mechanism for letting the various components and subsystems of computer system 800 communicate with each other as intended. Although bus subsystem 804 is shown schematically as a single bus, alternative embodiments of the bus subsystem can utilize multiple busses.

Network interface subsystem 816 can serve as an interface for communicating data between computer system 800 and other computer systems or networks. Embodiments of network interface subsystem 816 can include, e.g., Ethernet, a Wi-Fi and/or cellular adapter, a modem (telephone, satellite, cable, ISDN, etc.), digital subscriber line (DSL) units, and/or the like.

Storage subsystem 806 includes a memory subsystem 808 and a file/disk storage subsystem 810. Subsystems 808 and 810 as well as other memories described herein are examples of non-transitory computer-readable storage media that can store executable program code and/or data that produce circuits having the functionality of embodiments of the present disclosure.

Memory subsystem 808 includes a number of memories including a main random access memory (RAM) 818 for storage of instructions and data during program execution and a read-only memory (ROM) 820 in which fixed instructions are stored. File storage subsystem 810 can provide persistent (e.g., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art.

It should be appreciated that computer system 800 is illustrative and many other configurations having more or fewer components than system 800 are possible.

FURTHER EXAMPLES

Each of the following non-limiting features in the following examples may stand on its own or may be combined in various permutations or combinations with one or more of the other features in the examples below.

In one embodiment, the present disclosure includes a digital circuit comprising a first plurality of switches comprising M inputs and a plurality of outputs and configured to receive a plurality of input digital values having not more than N non-zero values on the M inputs, wherein the first plurality of switches are arranged in a plurality of groups of switches, wherein non-zero values received on inputs of each group of switches are compressed to adjacent outputs, beginning on a distal output, of each group, and shifted by an amount equal to a total number of non-zero inputs received on inputs of other groups between a particular group and a distal input of the M inputs of the first plurality of switches, where M and N are integers and M is greater than N; and a second plurality of switches having a plurality of inputs and N outputs and configured to consecutively couple non-zero outputs of the first plurality of switches to the N outputs of the second plurality of switches.

In another embodiment, the present disclosure includes a method of compressing data comprising: receiving a plurality of input digital values on M inputs of a first plurality of switches, the input digital values having not more than N non-zero values wherein the first plurality of switches are arranged in a plurality of groups of switches, where M and N are integers and M is greater than N; compressing the non-zero values received on inputs of each group of switches to adjacent outputs, beginning on a distal output, of each group; shifting the non-zero values on the adjacent outputs by an amount equal to a total number of non-zero inputs received on inputs of other groups between a particular group and a distal input of the M inputs of the first plurality of switches; and consecutively coupling non-zero outputs of the first plurality of switches to the N outputs of the second plurality of switches.

In yet another embodiment, the present disclosure includes a machine-readable medium (e.g., non-transitory) storing a hardware definition language (HDL) program executable by a computer, the program comprising sets of instructions for: receiving a plurality of input digital values on M inputs of a first plurality of switches, the input digital values having not more than N non-zero values wherein the first plurality of switches are arranged in a plurality of groups of switches, where M and N are integers and M is greater than N; compressing the non-zero values received on inputs of each group of switches to adjacent outputs, beginning on a distal output, of each group; shifting the non-zero values on the adjacent outputs by an amount equal to a total number of non-zero inputs received on inputs of other groups between a particular group and a distal input of the M inputs of the first plurality of switches; and consecutively coupling non-zero outputs of the first plurality of switches to the N outputs of the second plurality of switches.

In one embodiment, M is a power of two (2) multiple of N.

In one embodiment, the first plurality of switches arranged in a plurality of groups of switches comprise a plurality of crossbar groups.

In one embodiment, each of the plurality of crossbar groups comprise multiplexers.

In one embodiment, the second plurality of switches comprise N multiplexers.

In one embodiment, the first plurality of switches comprise M outputs and the second plurality of switches comprise M inputs.

In one embodiment, the first plurality of switches comprise a first plurality of multiplexers, and wherein the second plurality of switches comprises a second plurality of multiplexers each having a number inputs equal to one (1) minus a number of the first plurality of multiplexers.

In one embodiment, a first distal group of switches of the first plurality of switches is coupled to a lower half group of the second plurality of switches; a second distal group of switches of the first plurality of switches, opposite the first distal group of switches, is coupled to an upper half group of the second plurality of switches; and groups of switches between the first distal group and the second distal group are coupled to the lower half group and upper half group of the plurality of switches.

In one embodiment, the first plurality of switches and the second plurality of switches are controlled based on a bit map vector specifying the position of the N non-zero values on the M inputs of the first plurality of switches.

In one embodiment, a first number of inputs of the plurality of inputs of the second plurality of switches is less than a second number of outputs of the plurality of outputs of the first plurality of switches.

In one embodiment, a first distal group of switches of the plurality of groups of switches is coupled to a first half of the second plurality of switches and not connected to a second half of the second plurality of switches, and a second distal group of switches of the plurality of groups of switches is coupled to the second half of the second plurality of switches and not connected to the first half of the second plurality of switches.

In one embodiment, said shift comprises barrel shifting.

In one embodiment, said shift is, for each group of switches, equal to a remainder of said total number for a particular group of switches divided by a number of outputs of the particular group of switches.

In one embodiment, the first plurality of switches comprise a plurality of stages.

In one embodiment, the second plurality of switches comprise a plurality of stages.

The above description illustrates various embodiments along with examples of how aspects of some embodiments may be implemented. The above examples and embodiments should not be deemed to be the only embodiments, and are presented to illustrate the flexibility and advantages of some embodiments as defined by the following claims. Based on the above disclosure and the following claims, other arrangements, embodiments, implementations and equivalents may be employed without departing from the scope hereof as defined by the claims.

What is claimed is:

1. A digital circuit comprising:
a first plurality of switches comprising M inputs and a plurality of outputs and configured to receive a plurality of input digital values having not more than N non-zero values on the M inputs, wherein the first plurality of switches are arranged in a plurality of groups of switches, wherein non-zero values received on inputs of each group of switches are compressed to adjacent outputs, beginning on a distal output, of each group, and shifted by an amount equal to a total number of non-zero inputs received on inputs of other groups between a particular group and a distal input of the M inputs of the first plurality of switches, where M and N are integers and M is greater than N; and
a second plurality of switches having a plurality of inputs and N outputs and configured to consecutively couple non-zero outputs of the first plurality of switches to the N outputs of the second plurality of switches.

2. The circuit of claim 1, wherein M is a power of two (2) multiple of N.

3. The circuit of claim 1, wherein the first plurality of switches arranged in a plurality of groups of switches comprise a plurality of crossbar groups.

4. The circuit of claim 3, wherein each of the plurality of crossbar groups comprise multiplexers.

5. The circuit of claim 1, wherein the second plurality of switches comprise N multiplexers.

6. The circuit of claim 1, wherein the first plurality of switches comprise M outputs and the second plurality of switches comprise M inputs.

7. The circuit of claim 1, wherein the first plurality of switches comprise a first plurality of multiplexers, and wherein the second plurality of switches comprises a second plurality of multiplexers each having a number inputs equal to one (1) minus a number of the first plurality of multiplexers.

8. The circuit of claim 1, further comprising:
a first distal group of switches of the first plurality of switches is coupled to a lower half group of the second plurality of switches;
a second distal group of switches of the first plurality of switches, opposite the first distal group of switches, is coupled to an upper half group of the second plurality of switches; and
groups of switches between the first distal group and the second distal group are coupled to the lower half group and upper half group of the plurality of switches.

9. The circuit of claim 1, wherein the first plurality of switches and the second plurality of switches are controlled based on a bit map vector specifying the position of the N non-zero values on the M inputs of the first plurality of switches.

10. The circuit of claim 1, further comprising a first number of inputs of the plurality of inputs of the second plurality of switches is less than a second number of outputs of the plurality of outputs of the first plurality of switches.

11. The circuit of claim 1, further comprising a first distal group of switches of the plurality of groups of switches is coupled to a first half of the second plurality of switches and not connected to a second half of the second plurality of switches, and a second distal group of switches of the plurality of groups of switches is coupled to the second half of the second plurality of switches and not connected to the first half of the second plurality of switches.

12. The circuit of claim 1, wherein said shift comprises barrel shifting.

13. The circuit of claim 1, wherein said shift is, for each group of switches, equal to a remainder of said total number for a particular group of switches divided by a number of outputs of the particular group of switches.

14. The circuit of claim 1, wherein the first plurality of switches comprise a plurality of stages.

15. The circuit of claim 1, wherein the second plurality of switches comprise a plurality of stages.

16. A method of compressing data comprising:
- receiving a plurality of input digital values on M inputs of a first plurality of switches, the input digital values having not more than N non-zero values wherein the first plurality of switches are arranged in a plurality of groups of switches, where M and N are integers and M is greater than N;
- compressing the non-zero values received on inputs of each group of switches to adjacent outputs, beginning on a distal output, of each group;
- shifting the non-zero values on the adjacent outputs by an amount equal to a total number of non-zero inputs received on inputs of other groups between a particular group and a distal input of the M inputs of the first plurality of switches; and
- consecutively coupling non-zero outputs of the first plurality of switches to N outputs of a second plurality of switches.

17. The method of claim 16, wherein M is a power of two (2) multiple of N.

18. The method of claim 16, wherein the first plurality of switches and the second plurality of switches are controlled based on a bit map vector specifying the position of the N non-zero values on the M inputs of the first plurality of switches.

19. The method of claim 16, wherein a first number of inputs of the plurality of inputs of the second plurality of switches is less than a second number of outputs of the plurality of outputs of the first plurality of switches.

20. A non-transitory machine-readable medium storing a hardware definition language (HDL) program executable by a computer, the program comprising sets of instructions for:
- receiving a plurality of input digital values on M inputs of a first plurality of switches, the input digital values having not more than N non-zero values wherein the first plurality of switches are arranged in a plurality of groups of switches, where M and N are integers and M is greater than N;
- compressing the non-zero values received on inputs of each group of switches to adjacent outputs, beginning on a distal output, of each group;
- shifting the non-zero values on the adjacent outputs by an amount equal to a total number of non-zero inputs received on inputs of other groups between a particular group and a distal input of the M inputs of the first plurality of switches; and
- consecutively coupling non-zero outputs of the first plurality of switches to N outputs of a second plurality of switches.

* * * * *